United States Patent
Feger et al.

(10) Patent No.: US 7,951,648 B2
(45) Date of Patent: May 31, 2011

(54) CHIP-LEVEL UNDERFILL METHOD OF MANUFACTURE

(75) Inventors: Claudius Feger, Poughkeepsie, NY (US); Nancy LaBianca, Yalesville, CT (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 12/166,286

(22) Filed: Jul. 1, 2008

(65) Prior Publication Data

US 2010/0003786 A1 Jan. 7, 2010

(51) Int. Cl.
*H01L 21/44* (2006.01)

(52) U.S. Cl. ........... 438/113; 438/26; 438/68; 438/464; 438/458

(58) Field of Classification Search .............. 438/25–26, 438/33, 51, 55, 68, 106–113, 458, 460–464
See application file for complete search history.

(56) References Cited

U.S. PATENT DOCUMENTS

| | | | |
|---|---|---|---|
| 6,919,420 B2 | 7/2005 | Buchwalter et al. | 528/230 |
| 6,924,171 B2 | 8/2005 | Buchwalter et al. | 438/106 |
| 7,391,119 B2 * | 6/2008 | Shi | 257/778 |
| 2005/0218517 A1 * | 10/2005 | Capote et al. | 257/738 |
| 2006/0043608 A1 | 3/2006 | Bernier et al. | |
| 2008/0265445 A1 * | 10/2008 | Feger et al. | 257/797 |

* cited by examiner

*Primary Examiner* — Dung A. Le
(74) *Attorney, Agent, or Firm* — Shimokaji & Assoc.

(57) ABSTRACT

A process comprises forming a first electrical interconnect structure on a surface of a singulated semiconductor chip having an alignment pattern, which is scanned and stored in a scanning device prior to application of a curable underfill coating to the surface of the singulated semiconductor chip. A curable underfill coating is applied to the surface of the singulated semiconductor chip to produce a coated semiconductor chip. The scanned and stored alignment pattern is delivered to an alignment and joining device positioned adjacent to and operatively associated with a substrate having a second electrical interconnect structure alignable to make electrical contact with the first electrical interconnect structure. The coated semiconductor chip is placed in the alignment and joining device so that when the scanned and stored alignment pattern is activated the alignment and joining device positions the coated semiconductor chip so that the first electrical interconnect structure is aligned to make electrical contact with the second electrical interconnect structure. The alignment and joining device is activated to join the coated semiconductor chip to the substrate.

19 Claims, 8 Drawing Sheets

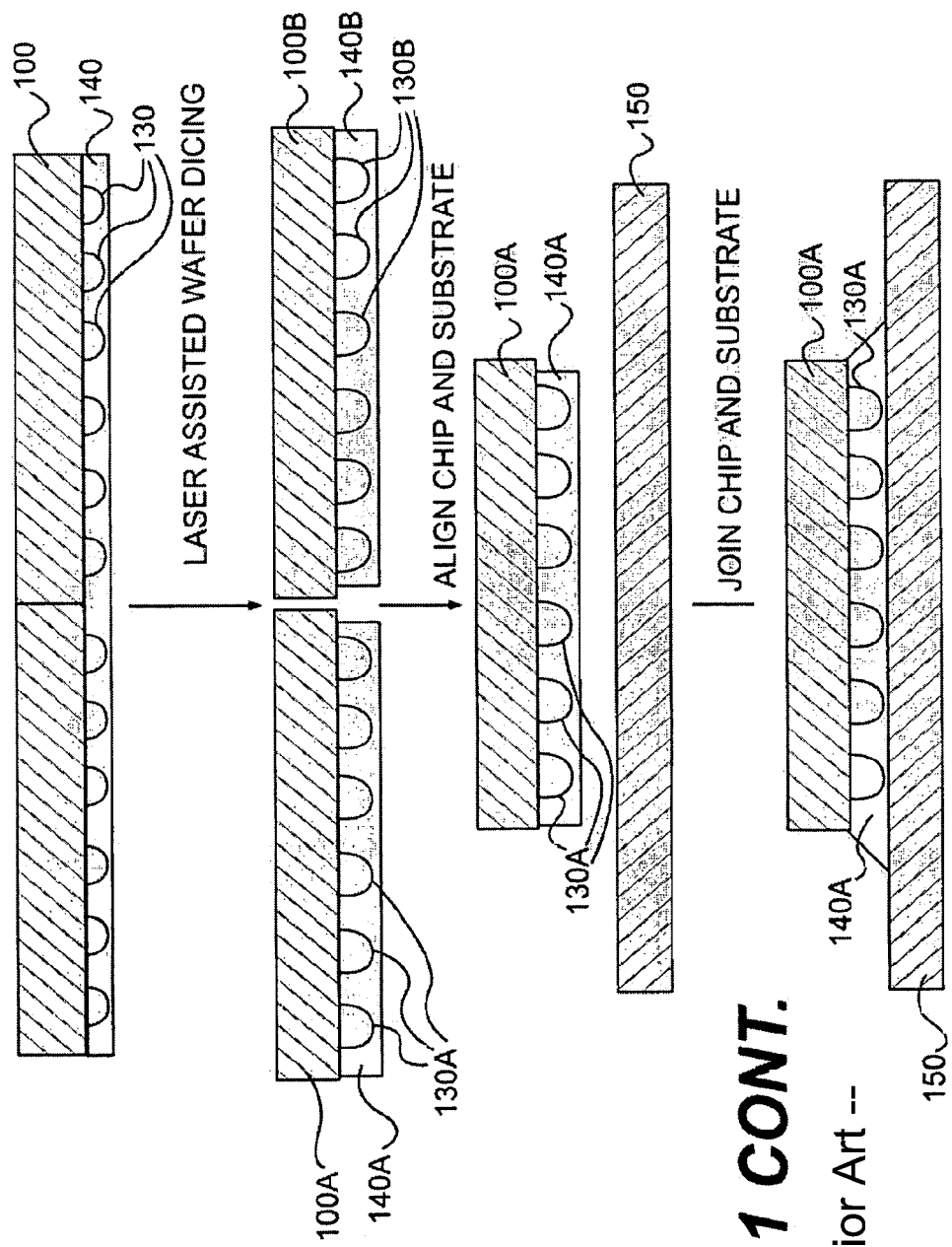
*FIG. 1 CONT.* -- Prior Art --

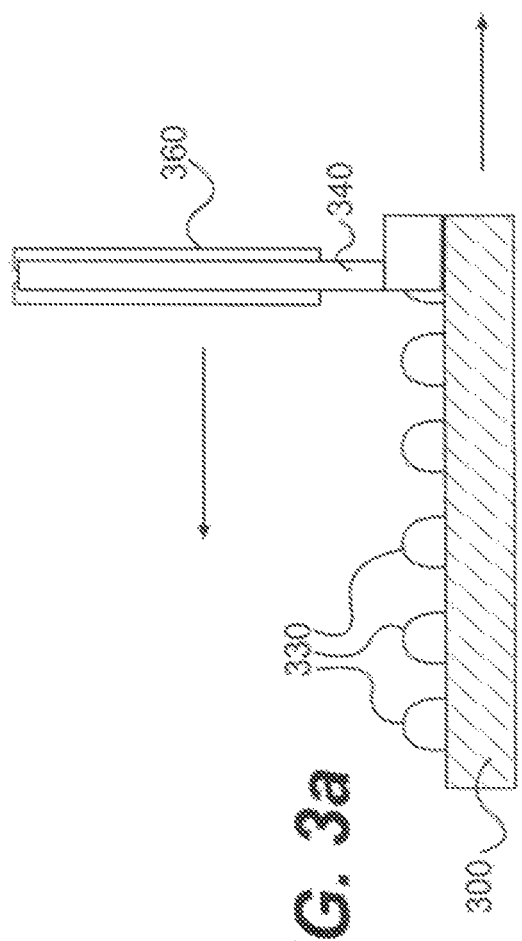
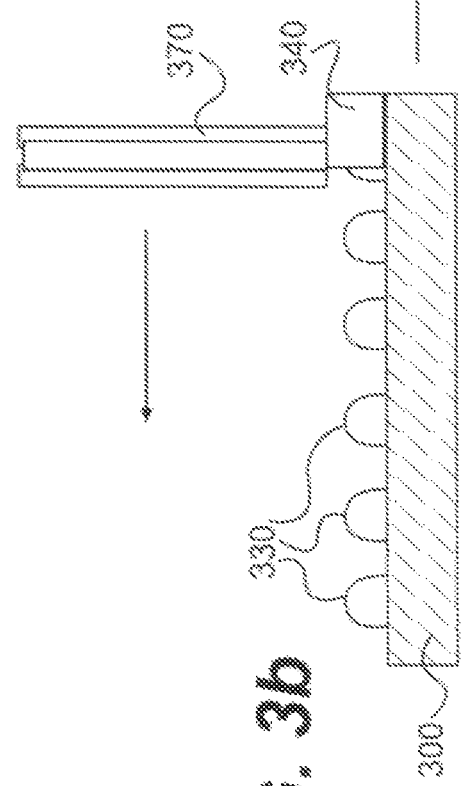
FIG. 3a
FIG. 3b

CHIP-LEVEL UNDERFILL METHOD OF MANUFACTURE

FIELD OF THE INVENTION

This invention relates to flip chip packages and processes to obtain such packages using a novel, chip-level underfill process.

BACKGROUND OF THE INVENTION AND RELATED ART

1. Background of the Invention

Flip chip technology is the fastest growing chip interconnect technology as it allows the largest numbers of I/Os (input/output) for the smallest footprint of the chip. This allows small packages including packages such as chip-scale packages.

Gruber et al. in their paper "Low-cost wafer bumping," *IBM Journal of Research and Development*, IBM JRD 49-4/5 (http://www.research.ibm.com/jpournal/rd/494/gruber.html) (Aug. 16, 2005) describe flip-chip solder-bump interconnections as the face-down soldering of integrated circuit (IC) devices to chip carriers by means of conductive bumps on the chip bond pad. The use of this bump technology also extends to passive filters, detector arrays and MEMs devices. IBM introduced this technology in the early 1960's with the solid logic technology in the IBM System/360™. It extended interconnection capabilities beyond existing wire-bonding techniques, allowing the area array solder-bump configuration to extend over the entire surface of the chip (die) providing solder bumps for interconnection to a substrate by the C4 (controlled collapse chip connection) solder reflow process developed by IBM. This allowed for the highest possible I/O counts to meet the increasing demand for electrical functionality and reliability in IC technology.

The original wafer-bumping process of metal mask evaporation in which ball-limiting metallurgy (BLM) also known as under board metallization, or under mask metallization, or under mask-bump metallurgy (UBM) involve the evaporation onto a wafer surface of solder through mask openings in an area array fashion. The need for increased I/O density and count, and pressures to lower the cost of flip-chip interconnections have spurred the development of other wafer bumping techniques such as electroplating or stencil-printing/paste-screening (solder paste) bump processes. Some of the more newly developed bumping processes include transfer printing, solder jetting, and bumpless and conductive particle applications.

In its broader aspect, BLM, or UBM comprises the application of a metal coating to the die contact pads such as aluminum or copper contact pads, where the metal coating provides a surface that can adhere to solder. One process involves cleaning an aluminum terminal pad followed by activation to remove any aluminum oxide layer on the pad and applying a thin layer of zinc by means of a single or double zincate coating. By following this coating with an electroless Ni(P) plating process the zinc is replaced with nickel which forms a strong bond between the nickel and aluminum. Manufacturers use a similar process for a copper terminal pad with the exception that they clean the pad first with a dilute etchant, followed by activation with a palladium dispersion or solution and then apply the electroless Ni (P) film, or alternatively an electrolytic or sputtered Ni (V) film. Subsequent steps involve application of solder, e.g., solder "bumps" to the metal coating. Gruber et al. (supra) give a detailed explanation of all of the foregoing processes.

The so-called "solder bumps" provide a space between the chip and the substrate, usually filled in the last steps of the assembly process with a nonconductive "underfill" material that adhesively joins the entire surface of the chip or die to the substrate. The underfill not only blocks water or other contaminants from entering into the structure but also locks the chip or die to the substrate so that differences in thermal expansion do not breaker damage the electrical connections of the bumps.

Government regulations and customer needs have also impacted flip-chip interconnection technology requiring manufacturers to make a major transition from Pb/Sn to Pb-free solders and to produce larger wafers. Pb-free solder introduced new challenges such as the compatibility of the bumping process with a wide variety of these solders, each of which may require different processing conditions. Additionally, the transition from 200-mm to 300-mm wafers requires a bumping process that can readily accommodate this nearly 125% area increase with no negative effect on bumping yields and/or overall bump quality.

As a result, new solder-bumping technologies have developed that include some of the attributes of plating (extendibility to larger wafers and smaller bump size/pitch) and solder paste screening (flexibility of Pb-free alloy selection and low cost). One process comprises injection-molded solder (IMS) technology developed at IBM Research as an outgrowth of earlier work using solder for high performance thermal joints.

Industry nonetheless pressed for lower cost, higher quality bumping processes, and to this end IBM developed the C4NP (C4 new process, announced on Sep. 13, 2004) for IMS wafer bumping processes. Gruber et al. (supra) describe this process which basically involves processing a wafer and a solder mold simultaneously, but in separate processes that subsequently merge. Solder fills the mold in a prearranged pattern, after which the filled mold goes through an inspection step and alignment step with a wafer. Prior to alignment the wafer undergoes BLM deposition and patterning followed by inspection. After aligning mold and wafer the assembled components go through a reflow process to transfer solder to the wafer.

Other publications also describes flip chip manufacturing methods including inter alia "Injection Molded Soldering," http//www.research.ibm.com/ims/; and "Flipchips.com Tutorials," http//www.flipchips.com/tutorial01html; http//www.flipchips.com/tutorial02ahtml; http//www.flipchips.com/tutorial06html; http//www.flipchips.com/tutorial12html; http//www.flipchips.com/tutorial16html; http//www.flipchips.com/tutorial18html; http//www.flipchips.com/tutorial48html; and http//www.flipchips.com/tutorial55html.

The overview of flip chip technology shows its major advantage lies in utilizing the total chip area to make the I/O connections, whereas wire bonding uses only the chip periphery. A disadvantage of flip chip technology is that stresses that arise from the thermal mismatch between the silicon (chip) thermal expansion coefficient (CTE) and the CTE of the substrate are borne fully by the solder bumps (C4s) used to make the interconnect between chip and substrate. As noted, in order to ameliorate the stresses flip chip packages are usually underfilled, i.e., a resin is placed between the chip and the substrate and acts as encapsulant of the solder bumps and an adhesive between chip and substrate. The effect of such underfills is that the long-time reliability of underfilled flip chip packages is greatly enhanced compared to counterparts without an underfill.

Such resin underfill can be applied by capillary flow, using a so-called no-flow process or by wafer-level applied processes. There are several wafer-level applied underfill processes, among them the Wafer-level Underfill (WLUF) process (FIG. 1) which uses an over-bump wafer-applied resin, that is then b-staged, followed by dicing of the wafer to singulate chips and finally joining the chips with the WLUF layer to substrates. The WLUF process has been described by Buchwalter, Feger, Hougham, LaBianca, and Shobha, U.S. Pat. No. 6,919,420.

The WLUF process, however, has a few drawbacks such as the fact that the WLUF material must be applied to the full wafer before chip singulation. This requires wafer testing to identify bad chip sites and wafer-level burn in, if chip burn in is required before the chip is joined to the package. While these processes are possible, they require special tooling and thus add cost to the package.

Further, functioning and non-functioning (a.k.a. good and bad) chip sites are coated during the wafer-level underfill apply process. The materials and processing cost for the bad chip sites through singulation has to be added to the cost of making the good WLUF coated chips. This cost can be significant, if the yield of the wafer is low, i.e., at the beginning of a new program or for complex chips.

Further, application of the WLUF material to the wafer requires storage until the wafer can be diced and further storage until the WLUF coated chips can be joined to the package. This requires stability of wafer-applied WLUF material for up to 6 months and may require storage of such wafers under nitrogen or other special conditions.

The WLUF layer may also obscure the C4 pattern and/or other alignment marks making it difficult to align WLUF coated, diced chips to the substrate before joining. The WLUF in this regard may contain high pigment or filler loading in order to ameliorate the difference in the coefficient of thermal expansion (CTE) of the semiconductor chip and the circuit board joined to it but this has other consequences. Increased pigment or filler loading further opacifies the WLUF making it difficult to ascertain alignment features or markings on the board and/or chip.

While these obstacles can be overcome as described by Feger et al. supra and U.S. Pat. No. 6,919,420, it would be of great advantage, if a process could be developed that could be applied to a singulated chip prior to joining. This would be of particular advantage for multi-chip modules and CSP (chip-size package) applications.

2. Related Art

The following references comprise related art teachings:

"Acid-cleavable Acetal and Ketal Based Epoxy Oligomers," S. Buchwalter, C. Feger, G. Hougham, N. LaBianca, and H. Shobha, U.S. Pat. No. 6,919,420.

"Bilayer Wafer-Level Underfill," S. L. Buchwalter, D. Danovitch, F. E. Doany, P. A. Gruber, R. Iyengar, N. C. LaBianca, U.S. Pat. No. 6,924,171.

"A Wafer-level Underfill process for Flip-chip Packaging," C. Feger, N. C. LaBianca, G. Hougham, H. K. Shobha, and S. L. Buchwalter, Proc. IMAPS Flip. Chip Tech. 2003 (Feger et al.)

R. Mahidhara, "Comparing Chip-Scale Packaging to Direct Chip Attach," ChipScale, May-June 1999

L. Crane, D. Gamota, R. W. Johnson, and P Neathway, "Making Direct Chip Attach Transparent to Surface Mount Technology," ChipScale, September-October, 1999 B. Ma, E. Zhang, S. H. Hong, Q. Tong and A. Savoca, "Material Challenges for Wafer Level Packaging", Proc. Int. Symp. on Adv. Packag. Materials Processes, Properties and Interfaces P. 68, 2000.

The present invention provides such processes that address these needs to not only provide advantages over the related art, but also to substantially obviate one or more of the foregoing and other limitations and disadvantages of the related art. The written description, claims, abstract of the disclosure, and the drawings, that follow set forth various features, objectives and advantages of the invention and how they may be realized and obtained. They will also become apparent by practicing the invention.

SUMMARY OF THE INVENTION

To achieve these and other advantages, and in accordance with the purpose of the invention as embodied and broadly described herein, the invention comprises a process for over-bump coating of one or more singulated chips with an over-bump applied resin (OBAR), aligning a chip thus coated with a substrate and joining them to the substrate thus creating an underfilled package in which this resin becomes the underfill. The invention also relates to structures made by joining the chips to a substrate.

BRIEF DESCRIPTION OF THE DRAWINGS

The accompanying Figures, incorporated into this specification, together with the detailed description herein serve to further illustrate various embodiments and to explain various principles and advantages of the present invention.

DETAILED DESCRIPTION OF THE INVENTION

Figure 1:
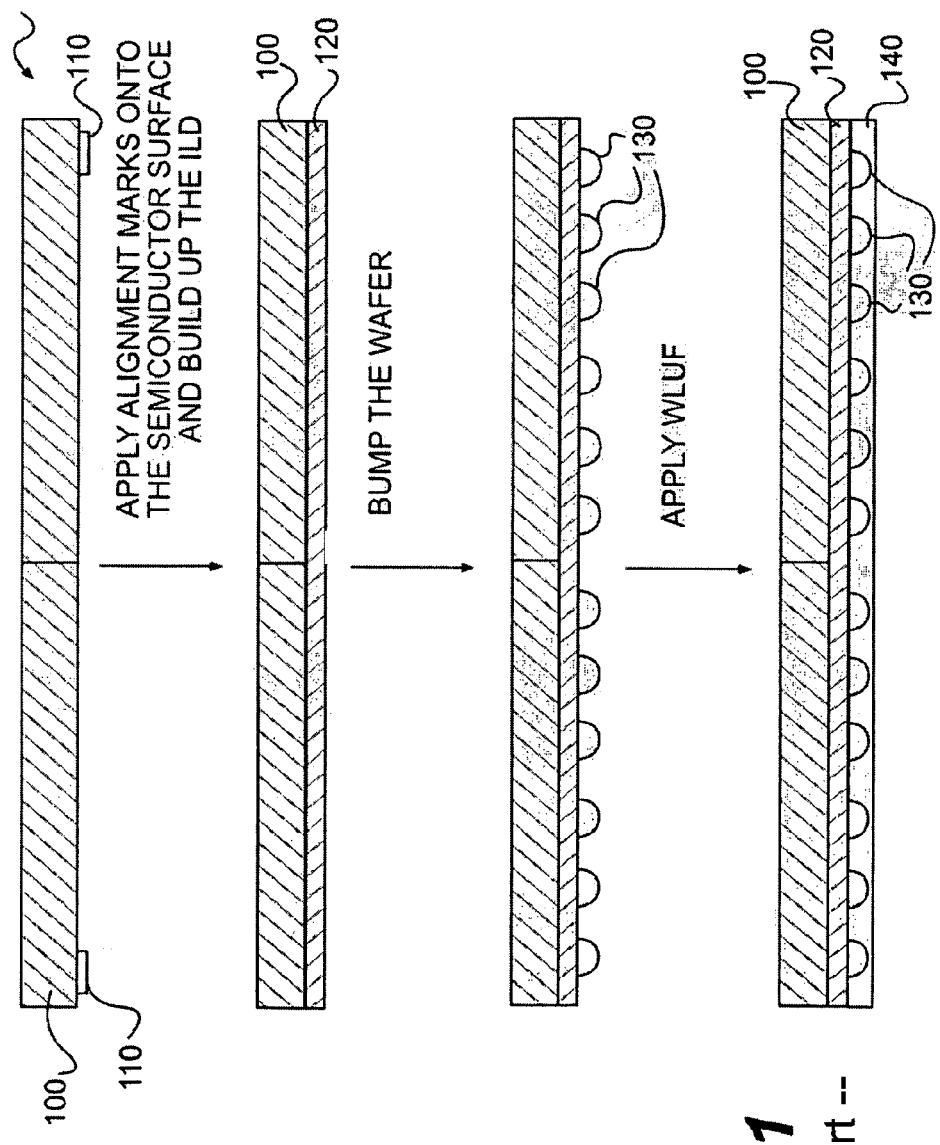
FIG. 1 comprises a side elevation in cross-section that depicts the prior-art wafer level underfill process FIG. 2 comprises a side elevation in cross-section that schematically depicts the chip level underfill process of the present invention FIG. 3 comprises a side elevation in cross-section that schematically depicts a curtain coating and meniscus coating embodiment of the present invention FIG. 4 comprises a side elevation in cross-section that schematically depicts various chip holders of the present invention that would allow over-bump underfill coating of the diced, and tested singulated chips according to the present invention.

The invention comprises a process for forming a first electrical interconnect structure on a surface of a semiconductor chip to produce an electrically connectable semiconductor structure where the electrically connectable semiconductor structure comprises at least one singulated semiconductor chip where the singulated chip includes an alignment pattern. The electrical interconnect structure on the surface of this semiconductor chip may be any structure known to those in the art such as an array of lead-containing or lead-free solder bumps, gold bumps, micro-bumps, or copper stud bumps. Kitajima, et al., U.S. Pat. No. 6,333,554; Poenisch, et al., U.S. Pat. No. 5,985,692 and Chen, et al., Published U.S. Patent Application No. 20070187522 disclose processes for manufacturing gold bump structures for semiconductors, whereas Joshi, et al., U.S. Pat. Nos. 7,271,497 and 6,731,003; disclose processes for manufacturing copper stud bump structures for semiconductors; and Akram, et al., U.S. Pat. No. 6,245,594 and Rostoker U.S. Pat. No. 5,767,580 disclose methods for forming micro-bumps for semiconductor devices.

In the most general aspect of the invention the singulated chip is coated with a resin over the electrically connectable structure. The resin may be applied from a solvent or in neat form, and it may be dried and slightly cured in a so-call b-stage step which involves heating the chip and resin to a temperature sufficient to substantially evaporate the solvent but insufficient to fully cure the resin. The coated semiconductor chip is then placed into a tool suitable to achieve alignment to a substrate having a second electrical interconnect structure and then joined in a subsequent step by applying pressure and heat until the electrical connection is made. The coating resin softens during this process, is displaced from the top surface of the electrical interconnect structure and is squeezed out at the sides of the chip to form a fillet. During this step the resin is substantially cured.

In a second aspect of the invention scanning and storing the alignment pattern in a scanning device produces a scanned and stored alignment pattern prior to application of the curable underfill coating over the electrically connectable structure on the surface of the singulated semiconductor chip. Applying the curable underfill coating produces a coated semiconductor chip, after which the coating is b-staged. This is followed by delivering the scanned and stored alignment pattern into an alignment and joining device positioned adjacent to and operatively associated with a substrate having a second electrical interconnect structure alignable to make electrical contact with the first electrical interconnect structure.

By placing the coated semiconductor chip in the alignment and joining device and activating the scanned and stored alignment pattern in the alignment and joining device we position the coated semiconductor chip so that the first electrical interconnect structure is aligned to make electrical contact with the second electrical interconnect structure. Activating the alignment and joining device joins the coated semiconductor chip to the substrate so that the first electrical interconnect structure is in electrical contact with the second electrical interconnect structure, and the resin surrounds the joint electrical interconnect structure, and as previously, forms a fillet and is substantially cured.

In another aspect, the invention comprises a process of over-bump coating of singulated integrated circuit (IC) chips with an over-bump applied resin (OBAR) material. The bumps of the IC chip can be any kind of structure known to those in the art such as lead-containing or lead-free solder bumps, gold bumps, micro-bumps, or copper stud bumps.

Stated otherwise, the invention comprises a process for forming a first electrical interconnect structure on a surface of a semiconductor chip to produce an electrically connectable semiconductor structure; the electrically connectable semiconductor structure comprising at least one singulated semiconductor chip; the singulated chip including an alignment pattern; applying a curable underfill coating to the surface of the singulated semiconductor chip and b-staging the curable underfill coating to produce a coated semiconductor chip; scanning and storing the alignment pattern in a scanning device prior to or after application of or b-staging the curable underfill coating to thereby produce a scanned and stored alignment pattern; delivering the scanned and stored alignment pattern into an alignment and joining device positioned adjacent to and operatively associated with a substrate having a second electrical interconnect structure alignable to make electrical contact with the first electrical interconnect structure; placing the coated semiconductor chip in the alignment and joining device; activating the scanned and stored alignment pattern in the alignment and joining device to position the coated semiconductor chip so that the first electrical interconnect structure is aligned to make electrical contact with the second electrical interconnect structure; activating the alignment and joining device to join the coated semiconductor chip to the substrate so that the first electrical interconnect structure is in electrical contact with the second electrical interconnect structure.

In further aspects, the invention comprises forming the first electrical interconnect structure on a surface of a semiconductor chip array in a wafer to produce the electrically connectable semiconductor structure; and dicing the electrically connectable semiconductor structure to produce at least one of the singulated semiconductor chips. The chip may be secured in a holding device prior to the applying of the curable underfill material. The underfill coating may be applied to the entire, surface of the singulated semiconductor chip or only part of the surface of the chip.

The first electrical interconnect structure may comprise electrically conductive bumps such as solder bumps, microbumps, gold stud bumps, or copper stud bumps.

In some aspects of the invention, the electrically conductive bumps are pitched at from about 5 micro-meters to about 250 micro-meters. Also, the singulated semiconductor chip is cleaned and dried before applying a curable underfill coating where cleaning may involve washing with DI(deionized) water, an aqueous solution containing a detergent, an aqueous solution containing an acid, an organic solvent, or a plasma cleaning or ashing process or any combination of these processes. The cleaning steps involving liquids may use ultrasonic assist, all of which is known in the art. Furthermore, the surface of the singulated semiconductor chip may be prepared to improve adhesion to the curable underfill coating by ashing or plasma cleaning of the surface in a manner known to those skilled in the art.

In a further aspect of the invention, the curable underfill coating is b-staged after it is applied to the surface of the singulated semiconductor chip, and is substantially cured in the process of joining the coated semiconductor chip to the substrate. The invention also includes a process wherein the first electrical interconnect structure is aligned to make electrical contact with the second electrical interconnect structure by the recognition of alignment marks.

The process of the invention also comprises placing a plurality of singulated chips on conveyor means so that the chips are operatively associated with the conveyor means, where the conveyor means comprises a movable planar surface aligned to move and deliver any of the chips to the scanning device and then to the joining device, where the movable planar surface comprises a linear surface such as a belt or sheet, or a curvilinear surface such as a disc or a drum or an arced curvilinear surface or a belt fed from and/or taken up by a drum means.

Thus, in another aspect, the invention comprises the foregoing process, but further comprising placing a plurality of singulated chips on conveyor means so that the chips are operatively associated with the conveyor means, where the conveyor means comprises a movable planar surface aligned to move and deliver any of the chips to the scanning device and/or the joining device.

In one embodiment the conveyor means comprises a structure fabricated from a polyimide polymer, but can also be made from a number of other polymers that will not substantially degrade when exposed to temperatures used in the process such as those employed to melt solder. These comprise inter alia epoxy polymers, phenolic polymers and the like; however, polymers such as these will generally not have the flexibility necessary for winding the conveyor on a drum such as a flexible belt structure of the invention fabricated from a polyimide, and will be used in a flat configuration or in combination with a flexible conveyor. Additionally, the conveyor means may comprise a metal, such as a metal that solder will not adhere to, e.g., stainless steel or other nickel or chromium alloys, aluminum, aluminum alloys, or nickel or chromium or aluminum coated metal or nickel, or chromium or aluminum coated polymers such as those noted herein and the like. Nickel or chromium or aluminum alloys may also be used as the metal coatings. Flexible conveyor means as those fabricated from polyimide, allow for winding the conveyor means on drums.

The flexible conveyor means can be advanced linearly from a drum by unreeling it whereas the inflexible conveyor means can be advanced linearly by means such as a piston, lever, screw, ratchet and pawl assembly, and the like, all of which are known to the skilled artisan, again, the latter being employed where the process and/or apparatus employ conveyor means that do not have sufficient flexibility to wind them on a drum. The conveyor means are operatively associated with prime mover means such as an electric motor or a device to operate a piston such as a hydraulic pump or an air compressor, all of which are well known in the art.

The invention also comprises a product produced by any one or combination of the foregoing processes.

Referring to the drawings, the invention comprises a further refinement of the wafer-level underfill process of the prior art, FIG. 1 which illustrates a semiconductor device 1 with the application of alignment marks 110 onto the semiconductor surface of wafer 100 and build up of the ILD 120 (inter-level dielectric) followed by the application of solder bumps 130 and a wafer level underfill (WLUF) 140 such as that described in U.S. Pat. Nos. 6,919,420 and 6,924,171. Laser assisted wafer dicing separates the semiconductor into a plurality of singulated sections, two of which are illustrated in FIG. 1, singulated device 100A having bumps 130A and WLUF 140A, whereas the other section comprises singulated device 100B, having bumps 130B and WLUF 140B which FIG. 1 shows joined to substrate 150 after alignment, heating to cause the solder bumps to flow and pressing against substrate 150.

Figure 2:
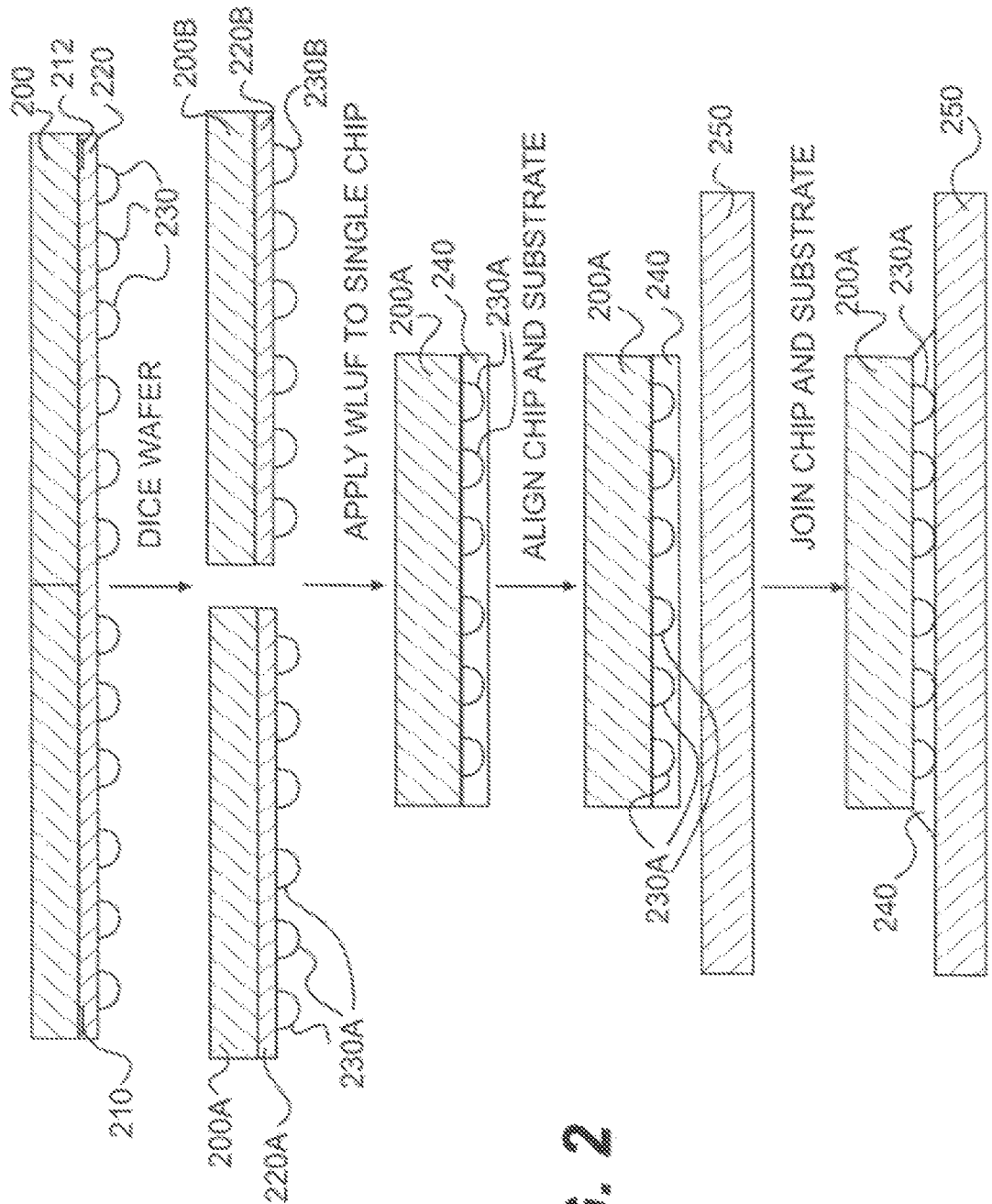

In the process of the present invention (FIG. 2) the surface of a bumped chip 2 is prepared by cleaning the semiconductor surface on wafer 200 or by using other surface preparation steps known to those skilled in the art and then applying bumps 230 over ILD 220. Semiconductor surface 200 may have alignment marks 210. We then dice the chip by any means known to those skilled in the art to form singulated chip 200A having ILD 220A and bumps 230A and singulated chip 200B having ILD 220B and bumps 230B. This is followed by seating with an over-bump applied resin (OBAR) 240 type of WLUF material by any one of the processes described below. The OBAR is also described in U.S. Pat. Nos. 6,919,420 and 6,924,171 and is used to cover the bumps 230 (which include structures such as micro-bumps, copper pillar bumps, and other structures used to make the electrical interconnection between chip and substrate). The OBAR material 240 is b-staged, or dried and partially cross-linked by heating for a certain amount of time, a process that is understood by those skilled in the art to drive off substantially any volatiles such as a solvent and to advance the reaction of the resin to a point before the gel point. B-staging renders the resin surface tack-free. The b-staged chip can then be stored, if necessary. When needed, the over-bump coated chip is aligned to a substrate 250 so that the electrical contacts on the chip, such as bumps as described herein are aligned with electrical contacts on the substrate such as a laminated circuit structure, circuit board or flex circuit having contact pads as is known in the art. We can employ methods described by Feger et al. supra and in U.S. Pat. No. 6,919,420 for this part of the process. We then heat the chip and/or substrate and then bring chip and substrate in contact with one another under controlled pressure, followed by continued heating while reducing the gap between substrate and chip to a set value followed by a potential increase in the gap size, and thus electrically joining the chip to the substrate to make an electronic package. We may use alignment marks as described by C. Feger et al. supra and in U.S. Pat. No. 6,919,420 to facilitate chip to substrate alignment.

Figure 4A:
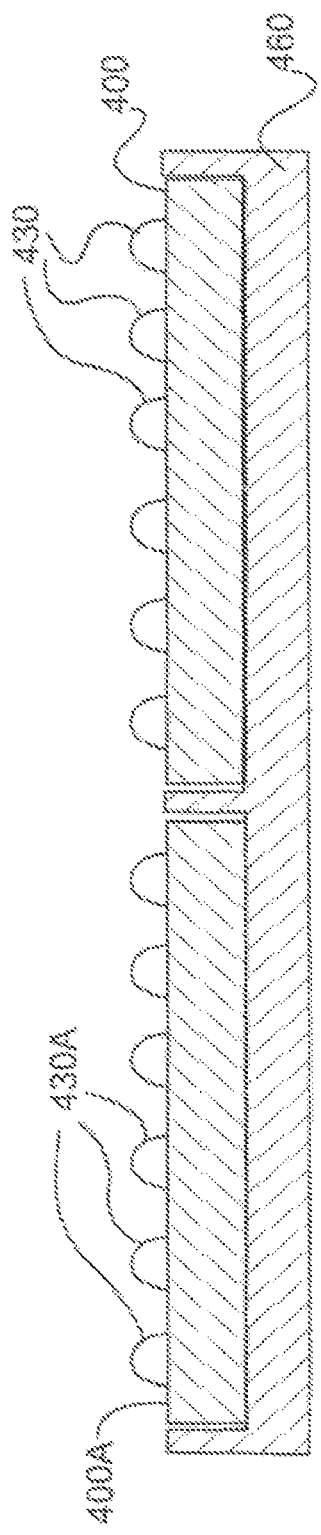
Figure 4B:
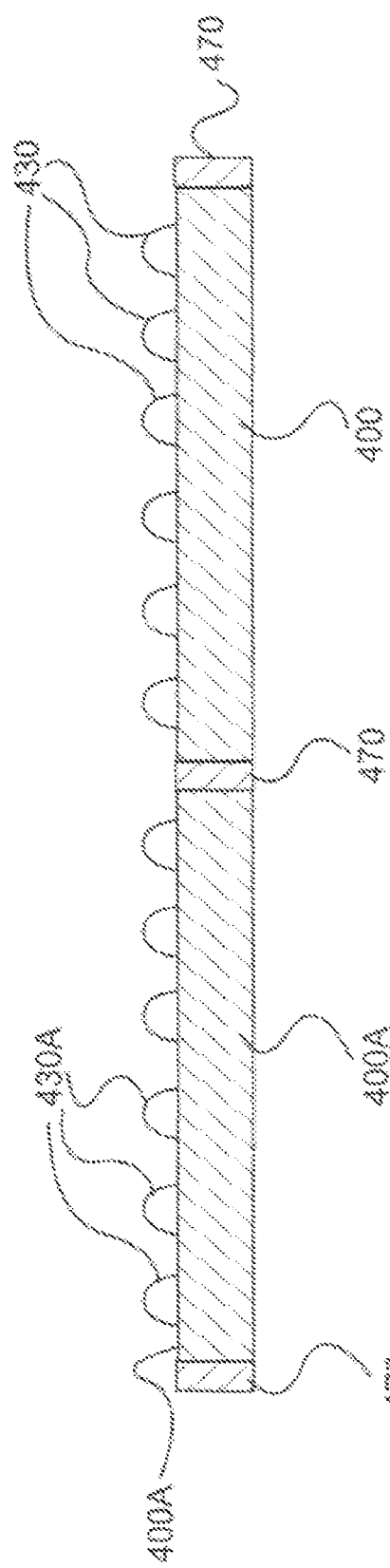

Methods used to apply the OBAR material to singulated chips include all methods known to those skilled in the art such as shown in FIG. 3 and comprising curtain coating of single chip 300 having bumps 330 with an OBAR 340 applied by a coating head 360 which applies the coating over the entire chip by either moving from one edge of the chip to the other or by moving the chip under coating head 360 from one edge to the other or moving both the chip 300 and the coating head 360 and at a distance sufficiently away from the chip to avoid forming a meniscus. Meniscus coating of single chips as illustrated in FIG. 3.b substantially follows the curtain coating process, but involves placing the coating head 370 sufficiently close to the contact bumps 330 on singulated chip 300 to form a meniscus coating of OBAR 340 as the chip 300 and/or the coating head 370 move to cover the distance from one edge to the other of chip 300. In another embodiment, we can employ spin coating of single chips, and any of these methods applied to a plurality of single chips which are held in a specific holder. Some embodiments of such holders are shown in FIG. 4, with holders 460 or 470 respectively holding chip 400 with bumps 430 and chip 400A with bumps 430A. Coated chips will undergo b-staging as described above.

Figure 5:
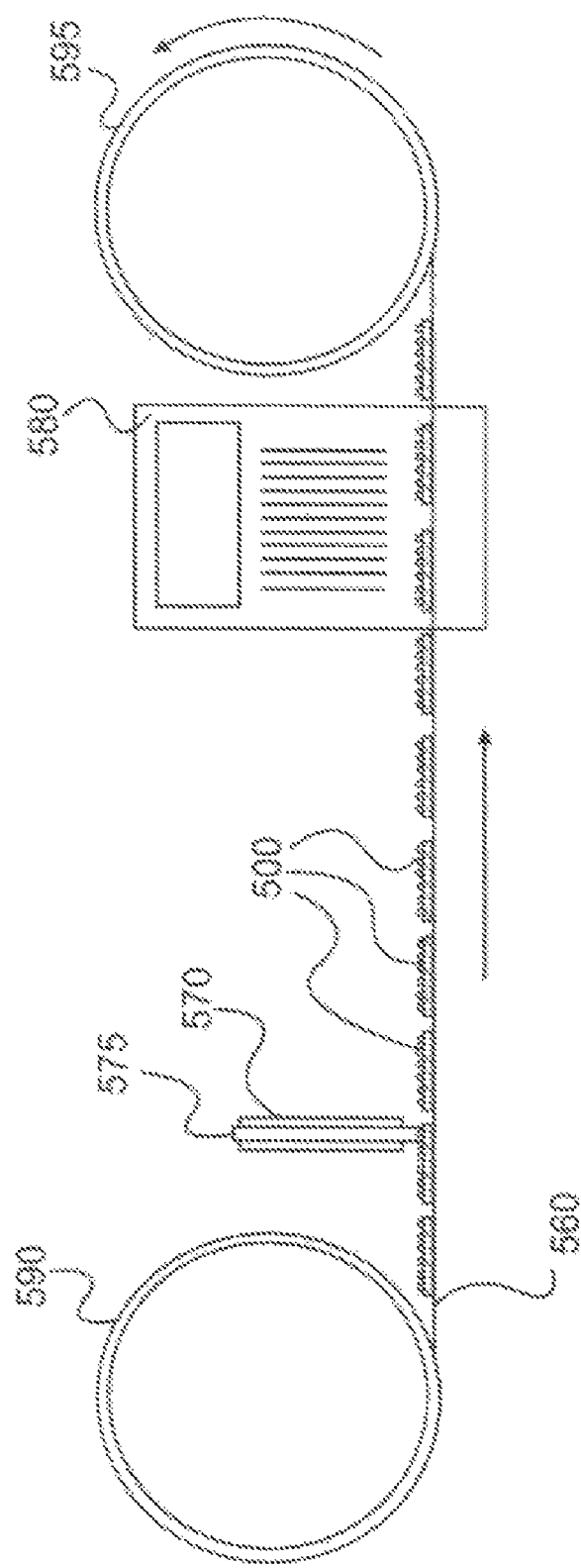
FIG. 5 comprises a side elevation in cross-section that schematically depicts a tape-to-reel embodiment of the present invention FIG. 6 comprises a side elevation in cross-section that schematically depicts the fully automated process of the present invention in which a) the chip is picked and alignment information is obtained optically and stored, b) a curable resin, i.e., an over-bump applied resin, which we designate OBAR is dispensed onto the chip, c) the OBAR coating is b-staged, d) b-staged chip and chip alignment information is transferred to the joining tool, e) the OBAR coated, b-staged chip is aligned to the substrate, and f) the chip is joined to the package and the underfill is cured. The foregoing may be followed by an optional post-cure step of the coating.

Curtain coating and meniscus coating of single chips work well in a fully automated tape to wheel process illustrated in FIG. 5, in which bumped chips 500 are mounted on a tape 560, unwound from a wheel 590, so that the chips 500 pass under a curtain or meniscus coater 570 to apply the OBAR 575 and then a furnace 580 for b-staging if that is necessary, after which the tape gets taken up onto a wheel 595.

Any variety of integrated circuit chips may be employed for this process such as Si chips, SiGe chips, or chips from any other semiconductor material. In the prior art aligning a chip requires to optically recognize alignment marks or the bump pattern through the over-bump-applied resin and using this information to align the chip to the substrate before chip to substrate joining.

Figure 6:
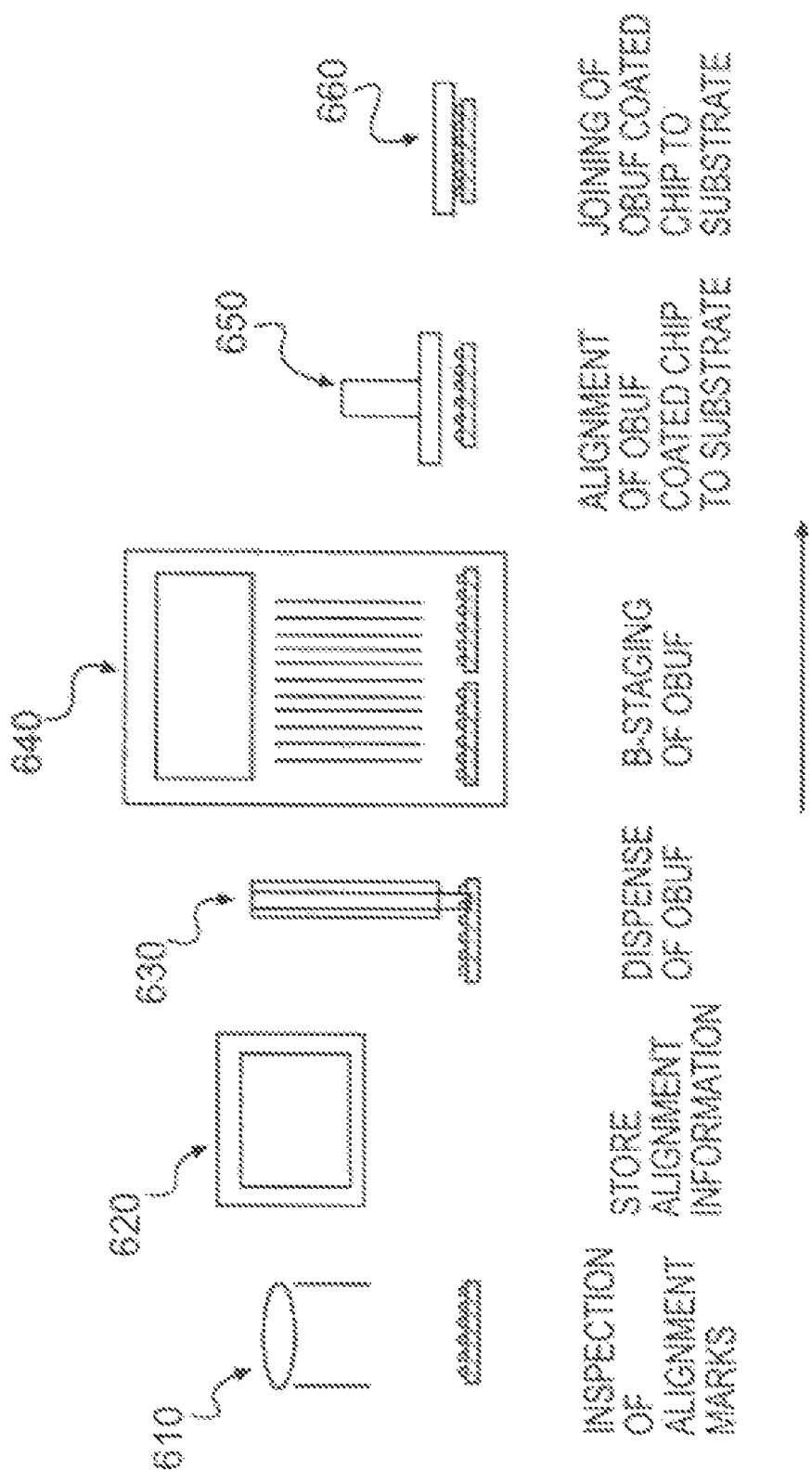

FIG. 6 comprises a schematic flow chart illustrating a method of practicing various features of the invention comprising a stage 610 for the inspection of alignment marks incorporated into the chip or chip bump pattern, a stage 620 for storing the alignment mark or bump pattern information, a stage 630 for dispensing the OBAR, a stage 640 for b-staging the OBAR, stage 650 for alignment of the OBAR coated chip to a substrate using the previously measured and stored alignment information and stage 660 for joining the OBAR coated chip to a substrate.

The requirement of transparency or translucency of the over-bump applied resin (OBAR) material limits its range of filler content or its range of layer thickness. On the other hand, it has been found that thicker layers of the OBAR material can lead to less inclusion of air during chip to substrate joining. Thus, the thicker the OBAR layer the higher the required translucency of the OBAR material. These limitations can be overcome with one embodiment of the current invention in which the alignment pattern is recognized and stored before applying the OBAR, keeping the chip in a precise alignment holder starting with the optical recognition step, through OBAR coating, b-staging, and joining.

Figure 7:
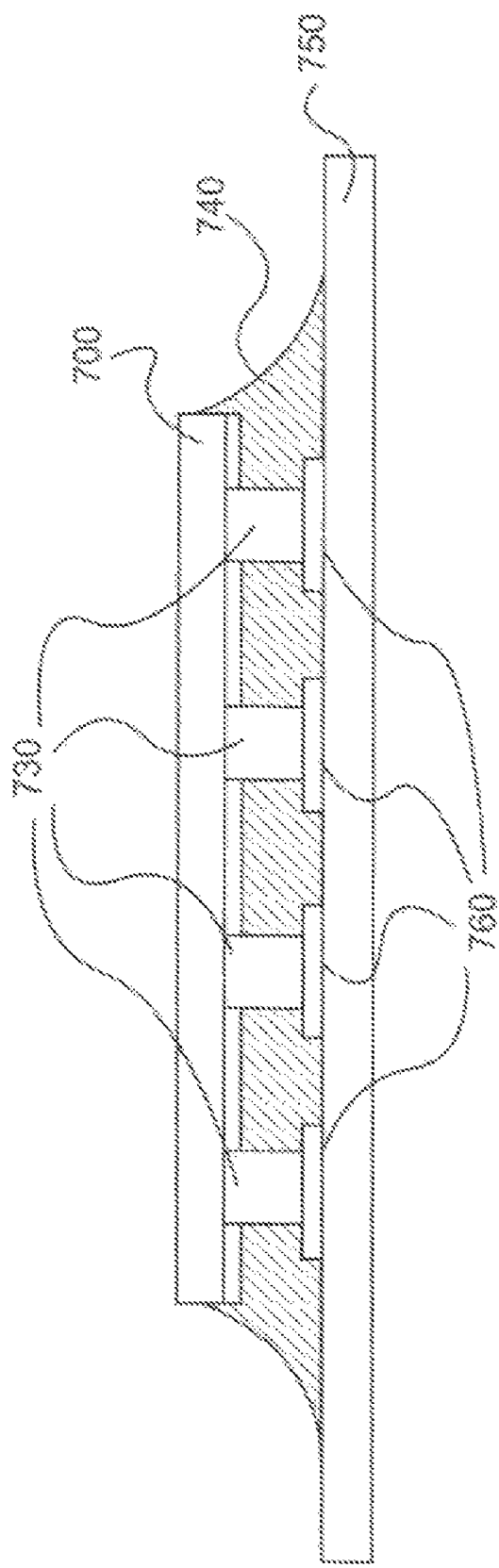
FIG. 7 comprises a side elevation in cross-section that depicts a final package obtained by the process of the present invention. It is an advantage of the present invention that these packages are identical to packages obtained with conventional underfills.

FIG. 7 comprises one embodiment of the invention, illustrating a device produced by the process of the invention comprising a chip 700 having bumps 730 extending through an OBAR 740 in electrical contact with pads 760 on substrate 750.

Alignment marks or C4 patterns are recognized by an optical system which uses an optical pattern recognition system which is standard in the industry, or x-rays. Generally, one would use x-rays to obtain the alignment marks or pattern, only if these cannot be seen by an optical system.

Throughout this specification, abstract of the disclosure, and in the drawings the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal; articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A process comprising forming a first electrical interconnect structure on a surface of a semiconductor chip to produce an electrically connectable semiconductor structure;
   said electrically connectable semiconductor structure comprising at least one singulated semiconductor chip;
   said singulated chip including an alignment pattern;
   applying a curable underfill coating to said surface of said singulated semiconductor chip and b-staging said curable underfill coating to produce a coated semiconductor chip;
   scanning and storing said alignment pattern in a scanning device prior to or after application of or b-staging said curable underfill coating to thereby produce a scanned and stored alignment pattern;
   delivering said scanned and stored alignment pattern into an alignment and joining device positioned adjacent to and operatively associated with a substrate having a second electrical interconnect structure alignable to make electrical contact with said first electrical interconnect structure;
   placing said coated semiconductor chip in said alignment and joining device;
   activating said scanned and stored alignment pattern in said alignment and joining device to position said coated semiconductor chip so that said first electrical interconnect structure is aligned to make electrical contact with said second electrical interconnect structure;
   activating said alignment and joining device to join said coated semiconductor chip to said substrate so that said first electrical interconnect structure is in electrical contact with said second electrical interconnect structure.

2. The process of claim 1 comprising forming said first electrical interconnect structure on a surface of a semiconductor chip array in a wafer to produce said electrically connectable semiconductor structure;
   dicing said electrically connectable semiconductor structure to produce at least one of said singulated semiconductor chips.

3. The process of claim 1 wherein said underfill coating is applied to the entire surface of said singulated semiconductor chip.

4. The process of claim 1 wherein said chip is secured in a holding device prior to said applying of said curable underfill material.

5. The process of claim 1 wherein said underfill coating is applied to only part of the surface of said singulated semiconductor chip.

6. The process of claim 1 wherein said first electrical interconnect structure comprises electrically conductive bumps.

7. The process of claim 6 wherein said electrically conductive bumps comprise
solder bumps.

8. The process of claim 6 wherein said electrically conductive bumps comprise
micro-bumps.

9. The process of claim 6 wherein said electrically conductive bumps comprise
gold stud bumps.

10. The process of claim 6 wherein said electrically conductive bumps comprise
copper stud bumps.

11. The process of claim 6 wherein said electrically conductive bumps
are pitched at from about 5 micro-meters to about 250 micro-meters.

12. The process of claim 1 wherein said singulated semiconductor chip is cleaned and dried before applying said curable underfill coating.

13. The process of claim 1 wherein the surface of said singulated semiconductor chip is prepared to improve adhesion to said curable underfill coating.

14. The process of claim 1 wherein said curable underfill coating is b-staged after it is applied to said surface of said singulated semiconductor chip.

15. The process of claim 14 wherein said curable underfill coating is substantially cured in the process of joining said coated semiconductor chip to said substrate.

16. The process of claim 1 wherein said first electrical interconnect structure is aligned to make electrical contact with said second electrical interconnect structure by the recognition of alignment marks.

17. A process comprising forming a first electrical interconnect structure on a surface of a semiconductor chip to produce an electrically connectable semiconductor structure;
said electrically connectable semiconductor structure comprising at least one singulated semiconductor chip;
said singulated chip including an alignment pattern;
scanning and storing said alignment pattern in a scanning device to produce a scanned and stored alignment pattern prior to application of a curable underfill coating to said surface of said singulated semiconductor chip;
delivering said scanned and stored alignment pattern into an alignment and joining device positioned adjacent to and operatively associated with a substrate having a second electrical interconnect structure alignable to make electrical contact with said first electrical interconnect structure;
placing said singulated semiconductor chip in said alignment and joining device;
activating said scanned and stored alignment pattern in said alignment and joining device to position said singulated semiconductor chip so that said first electrical interconnect structure is aligned to make electrical contact with said second electrical interconnect structure;
applying a curable underfill coating to said surface of said singulated semiconductor chip to produce after b-staging a coated semiconductor chip;
activating said alignment and joining device to join said coated semiconductor chip to said substrate so that said first electrical interconnect structure is in electrical contact with said second electrical interconnect structure.

18. The process of claim 1 comprising placing a plurality of singulated chips on conveyor means so that said chips are operatively associated with said conveyor means, where said conveyor means comprises a movable planar surface aligned to move and deliver any of said chips to said scanning device and/or said joining device.

19. The process of claim 18 wherein said movable planar surface comprises a linear surface or a curvilinear surface.

* * * * *